United States Patent
He et al.

(10) Patent No.: US 8,055,226 B2
(45) Date of Patent: Nov. 8, 2011

(54) FREQUENCY RESPONSE CORRECTION FOR A RECEIVER HAVING A FREQUENCY TRANSLATION DEVICE

(75) Inventors: Yi He, Portland, OR (US); Marcus K. Da Silva, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 1365 days.

(21) Appl. No.: 11/583,200

(22) Filed: Oct. 18, 2006

(65) Prior Publication Data

US 2008/0096489 A1   Apr. 24, 2008

(51) Int. Cl.
*H04B 11/00* (2006.01)
(52) U.S. Cl. ............... 455/226.1; 455/67.11; 455/67.14; 455/67.16; 455/226.2
(58) Field of Classification Search ............... 455/226.1, 455/67.11, 67.14, 67.16, 115.1, 115.2, 226.2, 455/226.3
See application file for complete search history.

(56) References Cited

U.S. PATENT DOCUMENTS

| | | | | |
|---|---|---|---|---|
| 5,262,957 A | * | 11/1993 | Hearn | 702/76 |
| 2002/0181633 A1 | * | 12/2002 | Trans | 375/354 |
| 2003/0161420 A1 | * | 8/2003 | Pupalaikis | 375/346 |

FOREIGN PATENT DOCUMENTS

| | | |
|---|---|---|
| DE | 3634528 C1 | 4/1988 |
| EP | 1187376 A2 | 3/2002 |

* cited by examiner

*Primary Examiner* — Tuan Pham
(74) *Attorney, Agent, or Firm* — Francis I. Gray; Michael A. Nelson

(57) ABSTRACT

A method of correcting the frequency response of an RF receiver having a frequency translation device and a fixed IF frequency section uses calibration data representing frequency responses over a wide frequency range for multiple center frequencies. The calibration data are based upon a multi-dimensional model for the frequency translation device that includes at least center frequency and offset frequency. The calibration data are stored in the RF receiver during factory calibration. A run-time normalization of the RF receiver produces a normalization frequency response at a reference frequency, and a relative frequency response at a desired center frequency is derived from the calibration data. The normalized and relative frequency responses are combined to produce an overall frequency response that is used by the RF receiver to configure an inverse filter to correct channel linear distortion produced by the frequency response of the frequency translation device at the desired center frequency.

4 Claims, 1 Drawing Sheet

FREQUENCY RESPONSE CORRECTION FOR A RECEIVER HAVING A FREQUENCY TRANSLATION DEVICE

BACKGROUND OF THE INVENTION

The present invention relates to RF receivers having a fixed frequency IF section, and more particularly to correction of the frequency response of an RF receiver having a frequency translation device.

Traditionally the normalization process or alignment process, i.e., self-calibration, for an RF receiver includes measuring a channel frequency response both in magnitude and phase by using a stimulus signal, usually generated internally, applied to an input of the receiver. It is assumed that the frequency response of the RF receiver front end having a frequency translation device is relatively flat over the IF bandwidth, i.e., the IF bandwidth response does not change with change in center frequency. Therefore the normalization process is only performed using the stimulus signal at a single reference frequency. When the device operates at other RF frequencies, the differences in frequency responses over the IF bandwidth at the other channel or center frequencies is ignored.

Frequency translation devices, such as mixers that combine an input signal with a frequency from a local oscillator to translate the input signal to a different frequency, are important components in radio frequency (RF) systems. The conversion by the mixers of RF power at one frequency into power at another frequency makes signal processing at a receiver easier and more efficient. For modern RF systems minimizing linear distortion along a signal path, including contributions from the frequency translation devices, is critical to meet signal quality requirements, such as Error Vector Magnitude (EVM) for communication systems.

In the RF receiver the mixer is just one building block in any signal path. Other cooperating circuits need to be considered since the mixer interacts with both the preceding and subsequent circuits in the signal path, as well as local oscillator (LO) driving circuits. All mixers are not fully isolated, leading to leakage or feed-through between mixer ports. Also mixers are non-linear devices which inevitably result in intermodulation distortion, leading also to a variable frequency response across the IF bandwidth. In traditional narrow bandwidth systems, such as 1-10 MHz intermediate frequency (IF) bandwidth systems, the mixers may be approximated as having ideal frequency responses, i.e., flat gain and linear phase over the mixer bandwidth, without causing too much degradation in system performance. RF receivers, such as those in traditional spectrum analyzers, make this assumption and only perform channel alignment at the center frequency.

However for wide bandwidth systems, such as RF receivers having signal paths with an IF bandwidth of 100 MHz and greater, the interaction between the mixer and cooperating circuits gets more complicated. Considerable errors occur if the mixer is only calibrated as having an ideal frequency response. This results in errors being generated in RF receivers. In test equipment having RF receivers such errors may result in the inability to reliably measure whether or not a device being tested meets required specifications.

What is desired is a method of correcting the frequency response of an RF receiver having a frequency translation device in a signal path over a wide IF bandwidth.

BRIEF SUMMARY OF THE INVENTION

Accordingly the present invention provides a method of correcting the frequency response of an RF receiver having a frequency translation device and a fixed frequency IF section. Calibration data in the form of a vector representation of the frequency responses of the frequency translation device for each channel of the RF receiver is stored in the RF receiver. The calibration data is based upon a multi-dimensional model of the frequency translation device that includes at least center frequency and offset frequency. During run-time normalization or alignment a normalization stimulus signal at a reference frequency, usually generated internally by the RF receiver, is applied to a signal input of the RF receiver, and the resulting frequency response is obtained The reference frequency response is then combined with a frequency response for the mixer at any desired center frequency derived by interpolation from the calibration data. The resulting overall frequency response is then used to configure an inverse filter in the RF receiver to compensate for the overall analog signal path linear distortion, including contribution from the frequency translation device at the desired center frequency.

The objects, advantages and other novel features of the present invention are apparent from the following detailed description when read in conjunction with the appended claims and attached drawing.

DETAILED DESCRIPTION OF THE INVENTION

Figures 1, 2, 3:
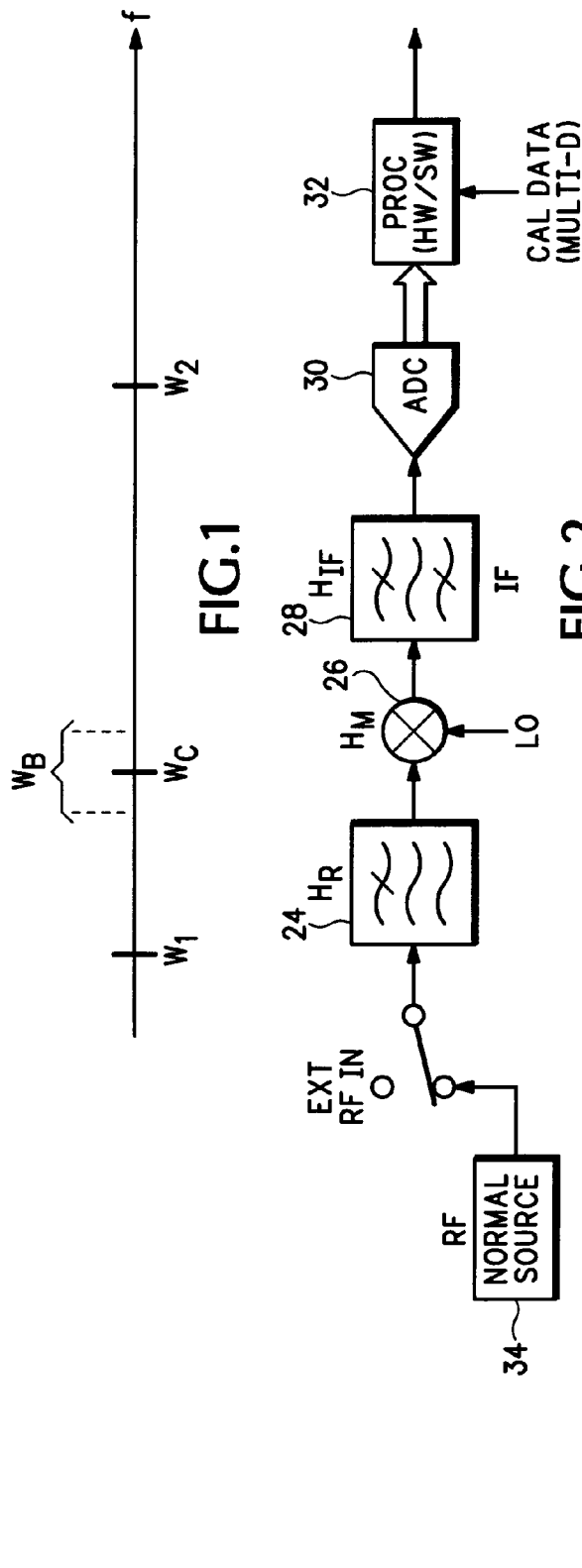
FIG. 1 is a graphic view of a wide IF bandwidth communication system having multiple channel center frequencies over a wide frequency range.
FIG. 2 is a generic block diagram for a typical RF receiver that includes frequency response correction according to the present invention.
FIG. 3 is a generic block diagram view of a typical RF receiver having multiple signal paths that includes frequency response correction according to the present invention.

For the following discussion "calibration" refers to the factory calibration of an RF receiver using external test equipment, and "normalization" or "alignment" refers to RF receiver self-calibration using an internal reference test signal.

Referring now to FIG. 1 a typical RF system has multiple channels over a wide frequency range, each channel having a unique center frequency, $\omega_c$, and a specified channel bandwidth, $\omega_b$. The RF system covers a frequency range from a start center frequency, $\omega_1$, to a stop center frequency, $\omega_2$. A channel frequency response for the RF receiver is modeled as a two-dimensional function of center frequency and offset frequency as follows:

$$H(\omega,\omega_c) = H_R(\omega+\omega_c)H_M(\omega,\omega_c)H_{IF}(\omega)$$

where H is the overall channel frequency response, $H_R$ is the RF frequency response preceding a mixer, $H_M$ is the RF mixer frequency response, $H_{IF}$ is the combined IF frequency response following the mixer and $\omega$ is the frequency offset from the channel center frequency, $\omega_c$. The frequency response may be expressed as a complex function that contains both magnitude and phase information. As a result the magnitude of the frequency response may be expressed as an absolute value of the complex frequency response. By recognizing that the mixer and its interacting circuits are essentially not separable, the combined frequency response is characterized during factory calibration at each of a plurality of center frequencies and may be used as a correction factor. Another factor that also enters into linear distortion in a signal path having a frequency translation device is the local oscillator (LO) drive level, which affects conversion loss, harmonic inter-modulation, reflection across ports and leakage. Therefore the calibration data may also include this "third" dimension to the multi-dimensional frequency translation device model.

Referring now to FIG. 2 the RF receiver has a low-pass image rejection filter 24 followed by an RF mixer 26 and multiple IF conversion stages generally represented as a single block or section 28, since the IF stages normally operate at fixed IF frequencies and the linear distortion introduced in the IF stages may be readily measured by the normalization procedure. The signal from the IF stages 28 is digitized by an analog-to-digital converter (ADC) 30. Digital signal processing may be implemented in digital hardware, such as a field programmable gate array (FPGA), and in software within a data processor 32. A normalization source 34, which is generally an internal signal generation module, generates a normalization stimulus signal with a specified magnitude and phase response during run-time.

The calibration data obtained during the calibration process at the factory is stored in the data processor 32 The calibration data may be described as described in co-pending U.S. patent application Ser. No. 11/583,188 entitled CHARACTERIZATION OF A FREQUENCY RESPONSE FOR A FREQUENCY TRANSLATION DEVICE. Alternatively any characterization data that represents the mixer as a multi-dimensional function may be used. In the following equation the frequency response is a complex function of two variables (expressed in linear scale, not dB). The complex frequency response at the calibration frequency, $\omega_c$, is:

$$H_c = H(\omega,\omega_c)/H(\omega,\omega_r) = \{H_R(\omega+\omega_c)H_M(\omega,\omega_c)\}/\{H_R(\omega+\omega_r)H_M(\omega,\omega_r)\}$$

After performing a run-time normalization, i.e., measuring the results from the normalization source 34 at the reference frequency, $T_r$, the channel response at the normalization frequency is:

$$H_n(\omega,\omega_r) = H_R(\omega+\omega_r)H_M(\omega,\omega_r)H_{IF}(\omega)$$

To determine the frequency response at any desired frequency, $\omega_d$, the calibration data is interpolated to obtain a relative frequency response at $\omega_d$ $$H_c(\omega,\omega_d,\omega_r) = H(\omega,\omega_d)/H(\omega,\omega_r) = \{H_R(\omega+\omega_d)H_M(\omega,\omega_d)\}/\{H_R(\omega+\omega_r)H_M(\omega,\omega_r)\}$$

By multiplying the relative frequency response from the calibration data with the frequency response at the normalization frequency, an overall frequency response at the desired frequency is obtained:

$$H(\omega,\omega_d) = H_R(\omega+\omega_d)H_M(\omega,\omega_d)H_{IF}(\omega) = H_n(\omega,\omega_r)H_c(\omega,\omega_d,\omega_r)$$

The data processor 32 then configures an inverse digital filter to compensate for the linear distortion with the following frequency response over the frequency range of the channel $$H^{-1}(\omega,\omega_d) = 1/H(\omega,\omega_d)$$

In some RF receivers, such as those in spectrum analyzers, multiple signal paths are used to cover a much wider frequency range. As shown in FIG. 3 a low-band path has a lowpass filter $24_L$ and a corresponding mixer $26_L$, while a high-band path has a bandpass filter 36 and a corresponding mixer $26_H$. The high-band path covers a higher frequency range than the low-band path. The above-described alignment technique may still be applied to both or either of the high-band and low-band path signals as required to meet system requirements.

Thus the present invention provides a method of correcting the frequency response of an RF receiver having a fixed IF frequency section by using calibration data in the form of a complex frequency response based upon a multi-dimensional model of a frequency translation device to modify a run-time normalization response at a reference frequency to calculate the frequency response at a desired center frequency, from which an inverse digital filter is built to process the signal applied to the RF receiver for greater measurement accuracy by reducing channel linear distortion.

What is claimed is:

1. An RF receiver comprising:
   an input section having a first frequency response characteristic for receiving an input signal;
   a frequency translation device having a second frequency response characteristic coupled to an output of the input section for converting power in the input signal at a first frequency to power at a second frequency;
   an IF section having a third frequency response coupled to the frequency translation device to receive the power at the second frequency and produce digitized data;
   a normalization signal source for selectively providing a test signal at a reference frequency to the input of the input section; and
   a data processor coupled to the IF section for receiving the digitized data, the data processor having calibration data representing the combination of the first, second and third frequency response characteristics as a complex function for a plurality of center frequencies, the calibration data being based upon a multi-dimensional model for the frequency translation device that includes at least center frequency and offset frequency for each of a plurality of center frequencies and the data processor (i) calculating a normalization frequency response for the digitized data produced by the test signal, (ii) determining a relative frequency response at a desired center frequency for the input signal from the calibration data, (iii) combining the normalization and relative frequency responses to produce an overall frequency response, and (iv) configuring an inverse filter from the overall frequency response for correcting the digitized data produced by the input signal.

2. The RF receiver as recited in claim 1 further comprising a plurality of signal paths, each signal path having an input section, a frequency translation device and an IF section, the input sections being selectively coupled to receive one of the input signal and the test signal and the IF sections providing digitized data selectively to the data processor according to the one of the plurality of signal paths selected so that the data processor configures the inverse filter according to the one of the plurality of signal paths selected.

3. The RF receiver as recited in claim 1 wherein the data processor further interpolates the calibration data in determining the relative frequency response at the desired center frequency.

4. The RF receiver as recited in claim 1 wherein the inverse filter is configured with a new overall frequency response by the data processor by repeating the determining and combining calculations when the desired center frequency is changed.

* * * * *